United States Patent
Yang et al.

(10) Patent No.: US 8,043,887 B2
(45) Date of Patent: Oct. 25, 2011

(54) THIN FILM TRANSISTOR, FLAT PANEL DISPLAY INCLUDING THE THIN FILM TRANSISTOR, AND METHOD FOR MANUFACTURING THE THIN FILM TRANSISTOR AND THE FLAT PANEL DISPLAY

(75) Inventors: Nam-Choul Yang, Yongin (KR); Hye-Dong Kim, Yongin (KR); Min-Chul Suh, Yongin (KR); Jae-Bon Koo, Yongin (KR); Sang-Min Lee, Yongin (KR); Hun-Jung Lee, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 0 days.

(21) Appl. No.: 12/641,277

(22) Filed: Dec. 17, 2009

(65) Prior Publication Data

US 2010/0099215 A1    Apr. 22, 2010

Related U.S. Application Data

(63) Continuation of application No. 11/298,211, filed on Dec. 9, 2005, now abandoned.

(30) Foreign Application Priority Data

Dec. 23, 2004   (KR) .................. 10-2004-0111097

(51) Int. Cl.
    *H01L 51/40* (2006.01)
(52) U.S. Cl. ............... 438/99; 257/40; 257/E51.001
(58) Field of Classification Search .............. 438/99
    See application file for complete search history.

(56) References Cited

U.S. PATENT DOCUMENTS

| 5,705,826 | A | 1/1998 | Aratani et al. |
| 6,498,114 | B1 | 12/2002 | Amundson et al. |
| 6,720,198 | B2 * | 4/2004 | Yamagata et al. ............. 438/29 |
| 2002/0022299 | A1 * | 2/2002 | Jackson ......................... 438/99 |
| 2003/0047729 | A1 | 3/2003 | Hirai et al. |
| 2005/0064623 | A1 | 3/2005 | Bao |

(Continued)

FOREIGN PATENT DOCUMENTS

JP    2003-508797    3/2003

(Continued)

OTHER PUBLICATIONS

Song, Chung-Kun (2002) Effects of hydrophobic treatment on the performance of pentacene TFT. KIEE International Transactions on EA. 12C-2, 136-138. XP0009012128.

(Continued)

*Primary Examiner* — Ken Parker
*Assistant Examiner* — Anthony Ho
(74) *Attorney, Agent, or Firm* — Knobbe Martens Olson & Bear LLP

(57) ABSTRACT

A thin film transistor having a transformed region that provides the same result as patterning a semiconductor layer, a flat panel display having the thin film transistor and a method for manufacturing the thin film transistor and the flat panel display are disclosed. The thin film structure includes a gate electrode, a source and a drain electrode, each insulated from the gate electrode and an organic semiconductor layer coupled to the source electrode and the drain electrode. The organic semiconductor layer includes the transformed region having a crystal structure distinguished from crystal structures of regions around the channel region.

12 Claims, 15 Drawing Sheets

U.S. PATENT DOCUMENTS

2006/0211180 A1* 9/2006 Nakayama et al. ........... 438/149

FOREIGN PATENT DOCUMENTS

KR  10 2005 0116746   12/2005
WO  WO 01/08241 A1   2/2001

OTHER PUBLICATIONS

Yagi, I. et al. (2004) Direct observation of contact and channel resistance in pentacene four-terminal thin-film transistor patterned by laser ablation method. American Institute of Physics. 84(5):813-815.

European Search Report dated Apr. 3, 2006 in 7 pages.

C. Pannemann et al. "Nanometer scale organic thin film transistor with Pentacene," Microelectronic Engineering, 67-68 (2003) p. 845-852.

First Office Action from State Intellectual Property Office, P.R. China, on Jan. 6, 2009 in 29 pgs.

Sundar et al., "Elastomeric Transistor Stamps: Reversible Probing of Charge Transport in Organic Crystals," Science, vol. 303, Mar. 12, 2004, 1644-1646.

Goldmann et al., "Hole mobility in organic single crystals measured by a "flip-crystal" field-effect technique," Journal of Applied Physics, vol. 96, No. 4, Aug. 15, 2000, 2080-2086.

* cited by examiner

THIN FILM TRANSISTOR, FLAT PANEL DISPLAY INCLUDING THE THIN FILM TRANSISTOR, AND METHOD FOR MANUFACTURING THE THIN FILM TRANSISTOR AND THE FLAT PANEL DISPLAY

CROSS-REFERENCE TO RELATED APPLICATIONS

This application is a continuation of and claims the benefit under 35 U.S.C. §120 of U.S. application Ser. No. 11/298,211, filed Dec. 9, 2005, which is hereby incorporated in its entirety by reference. This application and U.S. application Ser. No. 11/298,211 claim the benefit of Korean Patent Application No. 10-2004-0111097, filed on Dec. 23, 2004, in the Korean Intellectual Property Office, the disclosure of which is incorporated herein in its entirety by reference.

BACKGROUND OF THE INVENTION

1. Field of the Invention

The present embodiments relate to a thin film transistor (TFT), a flat panel display having the TFT and a method for manufacturing the TFT and the flat panel display; and more particularly, to a thin film transistor (TFT) having a transformed region in an organic semiconductor layer that provides the same result as patterning the organic semiconductor layer, a flat panel display having the TFT and a method for manufacturing the TFT and the flat panel display.

2. Description of the Related Art

A thin film transistor (TFT) has been used in a flat panel display as a switching element for controlling operations of each pixel or as a driving element for operating a pixel. The TFT includes a liquid crystal display element, an organic electroluminescent display element and an inorganic light emitting display element.

The TFT includes an active layer having a source region and a drain region which are doped with a high concentration of impurity and a channel region formed between the source region and the drain region. The TFT also includes a gate electrode formed on a predetermined region of a substrate where the channel region is faced and the gate electrode is insulated from the active layer. The TFT further includes a source electrode coupled to the source region and a drain electrode, each coupled to the drain region.

The flat panel display has become thinner and has been required to have flexibility.

For manufacturing thinner flat panel displays having flexibility, a plastic substrate has been used as a substrate of the flat panel display instead of a glass substrate. When using a plastic substrate, a high temperature thermal process cannot be performed in manufacturing the flat panel display. Accordingly, there are difficulties in using a conventional polysilicon thin film transistor for manufacturing the flat panel display.

To overcome the above problem, an organic semiconductor has been used. The organic semiconductor can be formed in a low temperature thermal process for manufacturing a thin film transistor (TFT) which is relatively inexpensive.

However, a photo lithographing method cannot be used for patterning the organic semiconductor layer. In other words, the pattern is formed on the organic semiconductor forming an active channel. If a combination method of a wet type and a dry type of etching methods is used for forming the pattern on the organic semiconductor, the organic semiconductor is damaged.

Therefore, a new method for patterning the organic semiconductor is needed.

SUMMARY OF THE INVENTION

One embodiment relates to a thin film transistor, comprising:
  a gate electrode;
  a source electrode and a drain electrode, each insulated from the gate electrode; and
  an organic semiconductor layer insulated from the gate electrode and coupled to the source electrode and the drain electrode,
  wherein the organic semiconductor layer comprises a transformed region around at least a channel region, the transformed region having a crystal structure distinguished from other regions.

In one aspect, the crystal size of the transformed region is smaller than the crystal size of the other regions.

In another aspect, the transformed region has lower current mobility than the other regions.

In yet another aspect, the transformed region is formed by emitting light on a predetermined region where the transformed region is formed.

In still another aspect, the transformed region is formed by performing a thermal process on a predetermined region where the transformed region is formed.

In another aspect, the transformed region comprises a boundary having a closed curve shape surrounding at least the channel region.

In another aspect, the transformed region comprises a boundary formed on at least one pair of substantially parallel lines where at least the channel region is located between the substantially parallel lines.

In another aspect, the transformed region comprises a boundary substantially parallel to a line connecting the source region, the channel region and the drain region.

In another aspect, an insulation layer is formed covering the gate electrode, and the organic semiconductor layer is formed on the insulation layer.

Another embodiment relates to an insulation layer covering the gate electrode; wherein, the source electrode and drain electrode are each formed on the insulation layer;
  a passivation layer covering the insulation layer, the source electrode and the drain electrode; wherein, the passivation layer has an opening over the source electrode or the drain electrode, wherein the organic semiconductor layer is formed on the passivation layer.

In another aspect, the source electrode and drain electrode are each formed on a substrate and the organic semiconductor layer is formed on the substrate so as to cover the source electrode and drain electrode.

In yet another aspect, the organic semiconductor layer is formed on a substrate, and the source electrode and the drain electrode are each formed on the organic semiconductor layer.

In still another aspect, the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, oligonaphthalene and its derivatives, oligothiophene of alpha-5-thiophene and its derivatives, phthalocyanine including metal and its derivates, phthalocyanine not including metal and its derivates, naphthalene tetracarboxylic diimide and its derivatives, naphthalene tetracarboxylic dianhydride and its derivatives, pyromellitic dianhydride and its derivatives, pyromellitic diimide and its derivatives, conjugated polymer containing thiophene and its derivatives and polymer containing fluorene and its derivatives.

Another embodiment relates to a flat panel display, comprising:

a substrate;

at least one thin film transistor, each of which is formed on the substrate and comprises a gate electrode, a source electrode and a drain electrode, each insulated from the gate electrode and an organic semiconductor layer coupled to the source electrode and the drain electrode and insulated from the gate electrode; and a pixel electrode electrically connected to at least one of the source and the drain electrodes of the thin film transistor, wherein the organic semiconductor layer comprises a transformed region around at least the channel region of the organic semiconductor layer, wherein the transformed region has a crystal structure which differs from other regions of the organic semiconductor layer.

In one aspect, the crystal size of the transformed region is smaller than a crystal size of the other regions.

In another aspect, the transformed region has lower current mobility than the other regions.

In yet another aspect, the transformed region is formed by irradiating a predetermined region with light where the transformed region is formed.

In still another aspect, the transformed region is formed by performing a thermal process on a predetermined region where the transformed region is to be formed.

In another aspect, the transformed region comprises a boundary having a closed curve shape surrounding at least the channel region.

In another aspect, the transformed region comprises a boundary formed on at least one pair of substantially parallel lines wherein at least the channel region is located between the substantially parallel lines.

In another aspect, the transformed region comprises a boundary substantially parallel to a line connecting to the source region, the channel region and the drain region.

In another aspect, an insulation layer is formed for covering the gate electrode and the organic semiconductor layer is formed on the insulation layer.

Another embodiment relates to an insulation layer covering the gate electrode; wherein, the source electrode and drain electrode are each formed on the insulation layer;

a passivation layer covering the insulation layer, the source electrode and the drain electrode, wherein the passivation layer has an opening over the source electrode or the drain electrode; wherein, the organic semiconductor layer is formed on the passivation layer.

In another aspect, the source electrode and drain electrode are each formed on a substrate and the organic semiconductor layer is formed on the substrate so as to cover the source electrode and drain electrode.

In yet another aspect, the organic semiconductor layer is formed on a substrate, and the source electrode and the drain electrode are each formed on the organic semiconductor layer.

In still another aspect, the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, oligonaphthalene and its derivatives, oligothiophene of alpha-5-thiophene and its derivatives, phthalocyanine including metal and its derivates, phthalocyanine not including a metal and its derivates, naphthalene tetracarboxylic diimide and its derivatives, naphthalene tetracarboxylic dianhydride and its derivatives, pyromellitic dianhydride and its derivatives, pyromellitic diimide and its derivatives, conjugated polymer containing thiophene and its derivatives and polymer containing fluorene and its derivatives.

Another embodiment relates to a method of manufacturing a thin film transistor comprising a gate electrode, a source electrode and a drain electrode, each insulated from the gate electrode; and an organic semiconductor layer insulated from the gate electrode and coupled to the source and the drain electrodes, the method comprises irradiating with light the area around at least a channel region of the organic semiconductor layer wherein the conductivity of the organic semiconductor layer is reduced.

In one aspect, the organic semiconductor layer is irradiated by a laser.

In another aspect, the organic semiconductor layer is irradiated with ultraviolet light.

In yet another aspect, the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, oligonaphthalene and its derivatives, oligothiophene of alpha-5-thiophene and its derivatives, phthalocyanine including a metal and its derivates, phthalocyanine not including a metal and its derivates, naphthalene tetracarboxylic diimide and its derivatives, naphthalene tetracarboxylic dianhydride and its derivatives, pyromellitic dianhydride and its derivatives, pyromellitic diimide and its derivatives, conjugate polymer containing thiophene and its derivatives and polymer containing fluorene and its derivatives.

Another embodiment relates to a method of manufacturing a thin film transistor comprising a gate electrode; a source electrode and a drain electrode, each insulated from the gate electrode; and an organic semiconductor layer insulated from the gate electrode and coupled to the source and drain electrodes, the method comprises performing a thermal process on the organic semiconductor layer at least near a channel region of the organic semiconductor layer after forming the organic semiconductor layer, wherein the conductivity of the organic semiconductor layer is reduced.

In one aspect, the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, oligonaphthalene and its derivatives, oligothiophene of alpha-5-thiophene and its derivatives, phthalocyanine including a metal and its derivates, phthalocyanine not including a metal or not and its derivates, naphthalene tetracarboxylic diimide and its derivatives, naphthalene tetracarboxylic dianhydride and its derivatives, pyromellitic dianhydride and its derivatives, pyromellitic diimide and its derivatives, conjugate polymer containing thiophene and its derivatives and polymer containing fluorene and its derivatives.

Another embodiment relates to a method of manufacturing a flat panel display, comprising:

forming a thin film transistor comprising a gate electrode formed on a substrate; a source electrode and a drain electrode, each insulated from the gate electrode; and an organic semiconductor layer insulated from the gate electrode and coupled to the source and drain electrodes; and forming a pixel electrode electrically connected to one of the source and the drain electrodes of the thin film transistor, the method comprises irradiating with light the area around at least a channel region of the organic semiconductor layer wherein the conductivity of the organic semiconductor layer is reduced.

In one aspect, the organic semiconductor layer is irradiated with a laser.

In another aspect, the organic semiconductor layer is irradiated with ultraviolet light.

In yet another aspect, the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, oligonaphthalene and its derivatives, oligothiophene of alpha-5-thiophene and its derivatives, phthalocyanine including a metal and its derivates, phthalocyanine not including metal and its derivates, naphthalene tetracarboxylic diimide and its derivatives, naphthalene tetracarboxylic dianhydride and its derivatives, pyromellitic dianhydride and its derivatives, pyromellitic diimide and its derivatives, conjugate polymer containing thiophene and its derivatives and polymer containing fluorene and its derivatives.

Another embodiment relates to a method of manufacturing a flat panel display, comprising:

forming a thin film transistor comprising a gate electrode formed on a substrate, a source electrode and a drain electrode, each insulated from the gate electrode; and an organic semiconductor layer insulated from the gate electrode and coupled to the source and the drain electrodes; and forming a pixel electrode electrically connected to one of the source and the drain electrodes of the thin film transistor, the method comprises performing a thermal process on the organic semiconductor layer at least near a channel region of the organic semiconductor layer after forming the organic semiconductor layer, wherein the conductivity of the organic semiconductor layer is reduced.

In one aspect, the organic semiconductor layer comprises at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, oligonaphthalene and its derivatives, oligothiophene of alpha-5-thiophene and its derivatives, phthalocyanine including metal and its derivates, phthalocyanine not including metal and its derivates. naphthalene tetracarboxylic diimide and its derivatives, naphthalene tetracarboxylic dianhydride and its derivatives, pyromellitic dianhydride and its derivatives, pyromellitic diimide and its derivatives, conjugate polymer containing thiophene and its derivatives and polymer containing fluorene and its derivatives.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described more fully with reference to the accompanying drawings, in which exemplary embodiments are shown.

Figure 1:
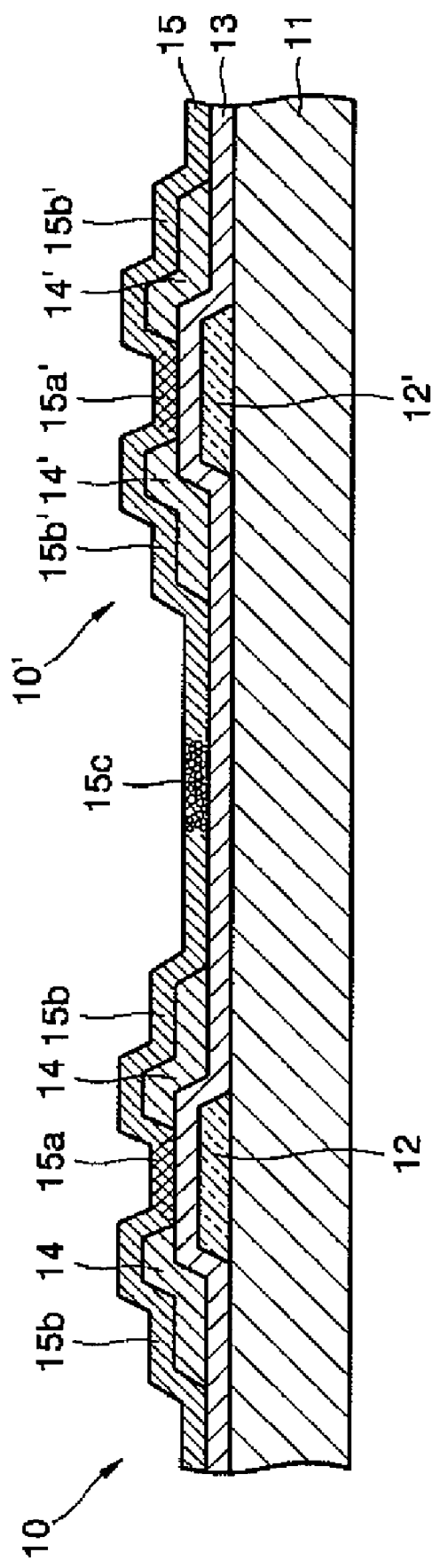
FIG. 1 is a cross sectional view of a thin film transistor in accordance with one embodiment.

FIG. 1 is a cross sectional view of a thin film transistor (TFT) in accordance with one embodiment.

As shown in FIG. 1, TFTs 10 and 10' are formed on a substrate 11. A flexible substrate may be used as the substrate 11. That is, a plastic substrate may be used as the substrate 11. However, the present embodiments are not limited to the use of a plastic substrate. Any flexible substrate can be used as the substrate 11 such as a predetermined thickness of flexible substrate made by a glass material or a metal material.

As shown in FIG. 1, the TFTs 10 and 10' are formed on the substrate 11 and they are adjacent. Also, TFTs 10 and 10' have substantially identical structure. Hereinafter, the structure of TFT 10 is explained.

A gate electrode 12 having a predetermined pattern is formed on the substrate 11 and a gate insulation layer 13 is formed to cover the gate electrode 12. A source electrode and a drain electrode 14 are each formed on the gate insulation layer 13. As shown in FIG. 1, the source electrode and the drain electrode 14 may be formed to overlap with a predetermined part of the gate electrode 12. However, the present embodiments are not limited to having the source electrode and the drain electrode 14 overlapping with the gate electrode 12. An organic semiconductor layer 15 is formed on the source electrode and the drain electrode 14 to cover the entire surface of the TFT 10.

The organic semiconductor layer 15 includes a source and a drain region 15b and a channel region 15a connecting the source and the drain regions 15b. An n-type organic semiconductor or a p-type organic semiconductor may be used for the organic semiconductor layer 15. Also, an n-type impurity or a p-type impurity may be doped on the source and the drain regions 15b.

The organic semiconductor layer 15 is formed by using organic semiconductor material including, for example, pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivates, a oligonaphthalene and its derivatives, oligothiophene of alpha-5-thiophene and its derivatives, phthalocyanine including a metal (e.g. Cu, Pt, etc) and its derivatives, phthalocyanine not including a metal (e.g. Cu, Pt, etc) and its derivates, naphthalene tetracarboxylic diimide and its derivatives, naphthalene tetracarboxylic dianhydride and its derivatives, pyromellitic dianhydride and its derivatives, pyromellitic diimide and its derivatives, a conjugate polymer containing thiophene and its derivatives and a polymer containing fluorene and its derivatives.

As shown in FIG. 1, the organic semiconductor layer 15 is entirely evaporated on the TFTs 10 and 10' to cover the entire surface of the TFT 10 and TFT 10'. Therefore, if patterning of the organic semiconductor layer 15 is not performed, it may generate cross-talk between TFTs 10 and 10'.

For preventing generation of cross-talk between the TFTs 10 and 10', a transformed region 15c is formed between the TFTs 10 and 10' in the present embodiments. The transformed region 15c is a predetermined region of the organic semiconductor layer 15 which is transformed to have a crystal structure different from other regions of the organic semiconductor layer 15.

In a view of single TFT 10, the transformed region 15c is formed around at least the channel region 15a. The transformed region 15c provides the same result as patterning the organic semiconductor layer 15.

A predetermined region of the semiconductor layer 15 is decomposed, phase transited or photo-oxidized to form the transformed region 15c. That is, by decomposing, phase transiting or photo-oxidizing, a crystal structure of the predetermined region becomes modified. In one embodiment, the predetermined region of the organic semiconductor layer 15 is irradiated with light to modify the crystal structure of the predetermined region of the organic semiconductor layer 15 as shown in FIGS. 2 and 3.

Figure 2:
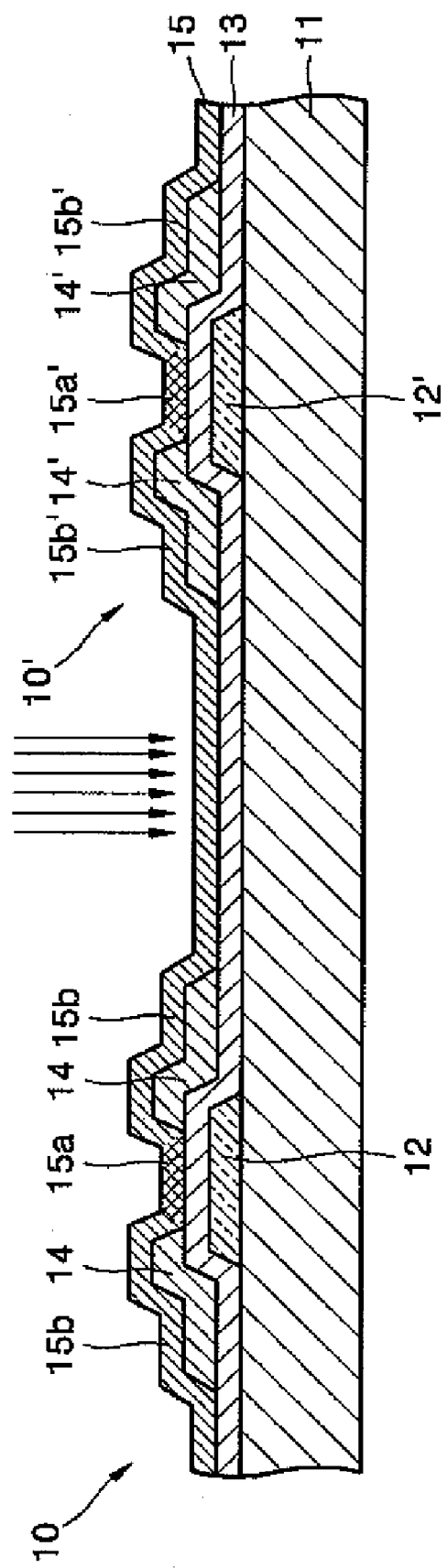
FIG. 2 is a cross sectional view of the thin film transistor of FIG. 1 which shows a method for manufacturing the thin film transistor in accordance with an embodiment.
Figure 3:
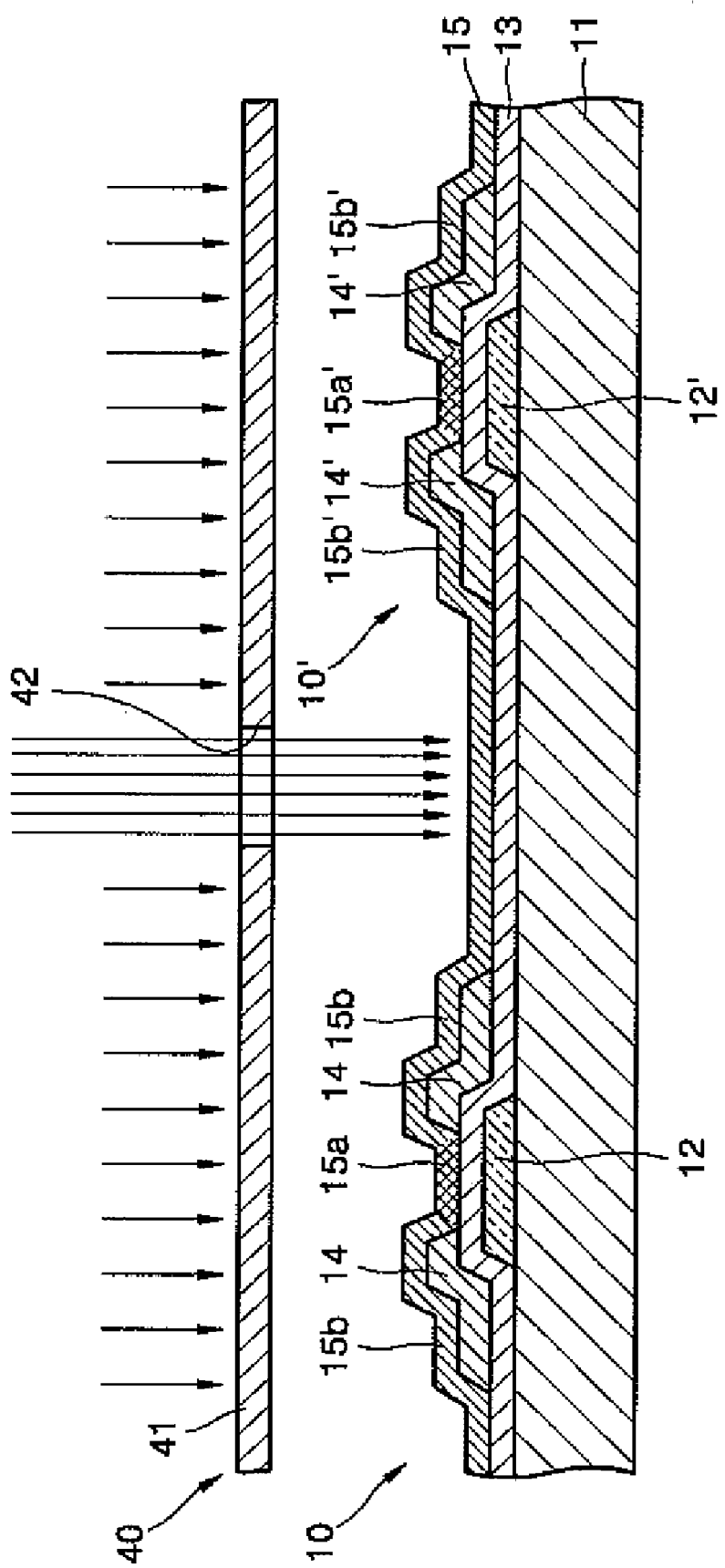
FIG. 3 is a cross sectional view of the thin film transistor of FIG. 1 which shows a method for manufacturing the thin film transistor in accordance with another embodiment.

FIG. 2 is a cross sectional view of a thin film transistor for demonstrating a method for forming a transformed region 15c by irradiating a predetermined region of an organic semiconductor layer 15 with a laser and FIG. 3 is a cross sectional view of a thin film transistor for demonstrating a method forming a transformed region 15c by exposing a predetermined region of an organic semiconductor layer 15 to ultraviolet (UV) rays.

As shown in FIG. 2, if the predetermined region of the organic semiconductor layer 15 is irradiated with a laser, the crystal structure of the predetermined region is changed by the heat locally generated by the laser. That is, the heat generated by the laser decomposes, photo-oxidizes or phase-transits the crystal structure of the predetermined region to be different from other regions of the organic semiconductor layer 15 (e.g. having a smaller crystal size).

As shown in FIG. 3, a mask 40 having a shielding portion 41 and an opening portion 42 is arranged above the TFTs 10 and 10' within a predetermined space and the mask 40 is irradiated with light. The opening portion 42 passes the radiated UV rays to the predetermined region of the organic semiconductor layer 15 and the shielding portion 41 blocks the UV rays irradiating the organic semiconductor layer 15. The predetermined region of the organic semiconductor layer 15 is exposed to the UV rays and the crystal structure of the predetermined region is changed by being decomposed, phase-transited or photo-oxidized. The crystal structure of the predetermined region becomes different from crystal structures of other regions of the organic semiconductor layer 15.

One characteristic of the transformed region 15c formed by the above mentioned methods becomes different from the other regions of the organic semiconductor layer 15. That is, the size of the crystal of the transformed layer 15c becomes smaller compared to crystals of other regions.

The transformed region 15c is formed on the organic semiconductor layer 15 for blocking crosstalk between TFTs 10 and 10'.

Degeneration of an organic material in the organic semiconductor layer 15 causes an increase in resistance. That is, when the size of the crystals of organic material in the organic semiconductor layer 15 becomes smaller, the resistance of the degenerated organic material increases. Accordingly, the degenerated organic material becomes an obstacle to transferring the carrier. Therefore, the degenerated organic material provides the same result as patterning the organic semiconductor layer to block carrier transferring between adjacent TFTs.

After a laser is directed to a predetermined region of the organic semiconductor layer 15, the carrier mobility of the predetermined region significantly decreases. This is disclosed by J. Picker in Applied Physics Letters, vol. 85, pp. 1377-1379, 2004 (hereinafter "Fisher").

In one embodiment, the method of Picker is used for obtaining the same result as patterning the organic semiconductor layer 15. That is, the laser is locally directed to a predetermined region of the organic semiconductor layer 15 for forming the transformed layer 15c. The transformed layer 15c blocks carrier transfer between adjacent TFTs. The transformed layer 15c provides the same result as patterning the organic semiconductor layer 15.

The transformed layer 15c can be formed by various other methods in addition to the method of Ficker supra.

It is known that if heat is applied to a pentacene layer evaporated in normal temperature, the crystallinity of the pentacene layer is maximized when the temperature becomes about 60° C., and a size of crystal grain becomes smaller and roughness of surface of the pentacene layer increases when the temperature increases over 80° C. (Rongbin Ye, *Jpn. J. Appl. Phys.* Vol. 42 (2003), pp. 4473-4475.)

Furthermore, it has been disclosed that characteristics of elements become degraded since the morphology is modified by annealing alpha-sexithienyl (a-6T) at 90° C. (F. Dinelli *Synthetic Metals* 146, pp. 373-376, 2004.) Moreover, if poly 3-hexylthiophene is annealed at high temperature, the poly 3-hexylthiophene is easily oxidized and the element characteristics become degraded in the article. (Brains A. Matties et. al., *Mat. Res. Soc. Symp. Proc.* Vol. 771 (2003), L10.35.1.)

Based on the above mentioned facts, the transformed region 15c may be formed by locally performing a thermal process on a predetermined region of the organic semiconductor layer. That is, if a region corresponding to the transformed layer 15c of the organic semiconductor layer 15 is locally thermal processed, the region of the organic semiconductor layer 15 is transformed so that the transformed region 15c is has degraded characteristics, that is it has lowered carrier mobility.

The local thermal process may be performed by irradiating light, such as UV rays, to a predetermined region of the organic semiconductor layer 15. However, the present embodiments are not limited to irradiating the transformed layer 15c with light for a thermal process. The local thermal process can be performed by arranging a heating wire pattern under the substrate 11 for heating the predetermined region of the organic semiconductor layer 15c.

The transformed region can be formed so that it results in various patterns.

FIGS. 4 through 17 show various patterns of a transformed region in accordance with the present embodiments.

In FIGS. 4 through 17, 12a represents a gate wire of a gate electrode 12 for transmitting a gate signal and data-wire 14a is connected to one of a source/drain electrode 14.

Figure 4:
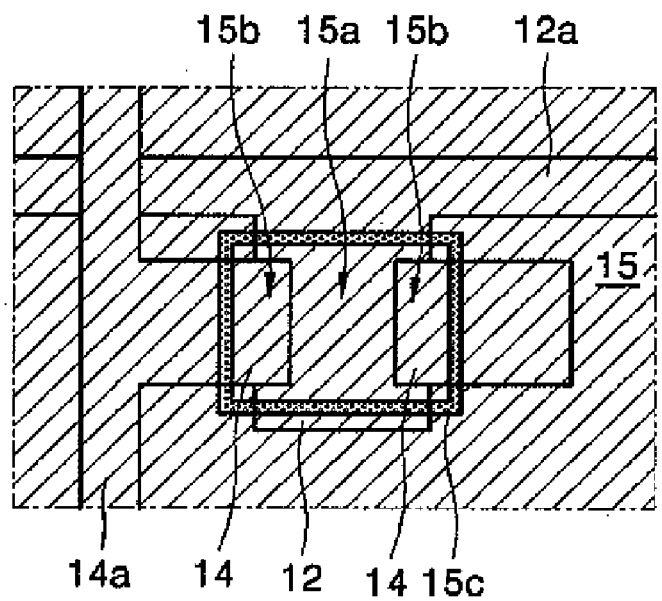
FIGS. 4 through 17 are diagrams showing various patterns of transformed region.
Figure 5:
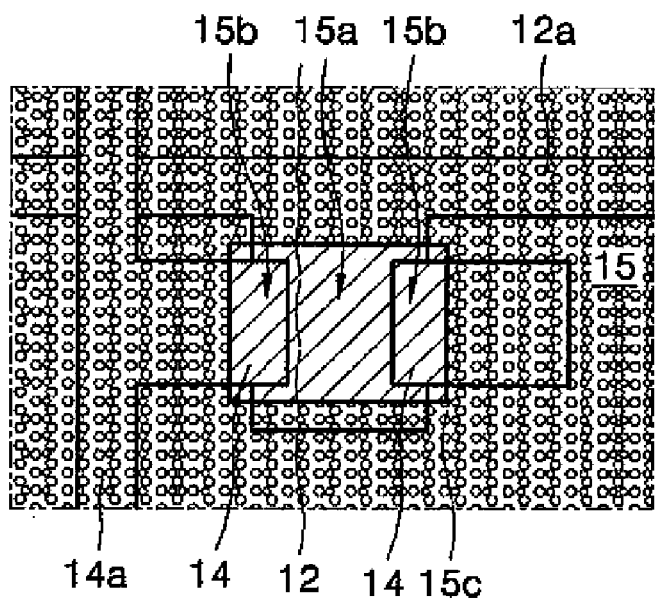
Figure 6:
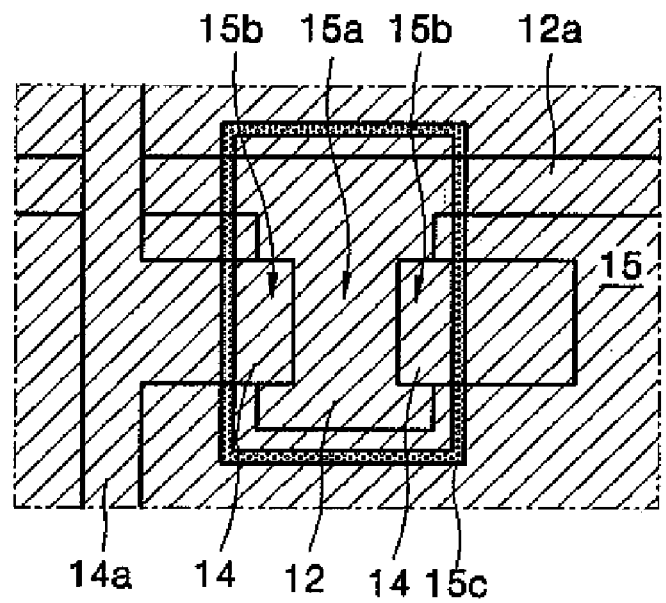
Figure 7:
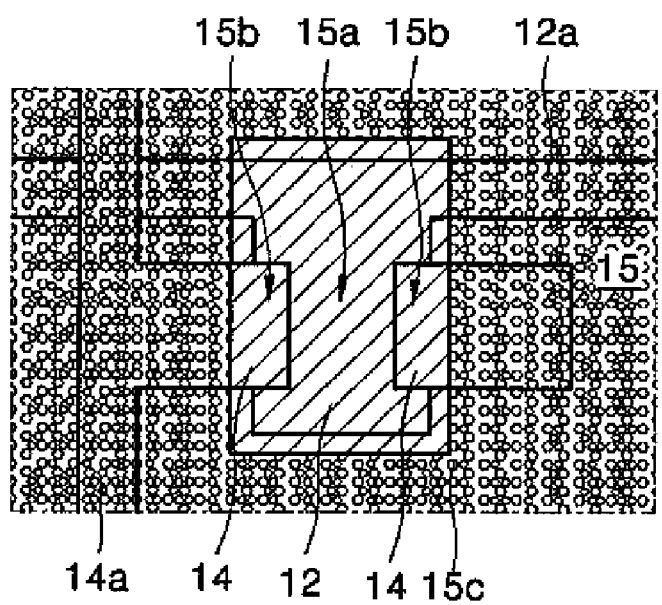

FIGS. 4 through 7 show a transformed region 15c having a closed curve shape of a boundary around a channel region 15a. As shown in FIGS. 4 and 6, the closed curve shape of the boundary may be formed to have a predetermined thickness. Also, the transformed region 15c is formed to have a closed curve shape of inner boundary for forming the transformed region 15c on outside of the channel region 15a as shown in FIGS. 5 and 7.

The boundary of the transformed region 15c may overlap a predetermined portion of the gate electrode 12 as shown in FIGS. 4 and 5. Also, the boundary of the transformed region 15c may be formed on the outside region of the gate electrode 12 as shown in FIGS. 6 and 7. The boundary of the transformed region 15c may be arranged at the inside of the gate wire 12a as shown in FIGS. 4 and 5 and the boundary of the transformed region 15c may be arranged outside of the gate wire 12a as shown in FIGS. 6 and 7.

As shown in FIGS. 8 to 15, boundaries of the transformed regions 15c may be formed on a pair of substantially parallel lines and the channel region 15a is located between the substantially parallel lines.

As shown in FIGS. 8, 10, 12 and 14, the transformed region 15c may be formed to have a line shape with a predetermined thickness. Furthermore, the transformed region 15c may be formed on an entire region which is outside the channel region 15a and inside boundaries of two transformed regions 15c are substantially parallel each other as shown in FIGS. 9, 11, 13 and 15.

A pair of the substantially parallel lines may be substantially parallel to the gate wire 12a as shown in FIGS. 8 through 11. Furthermore, a pair of the substantially parallel lines may be substantially parallel to one of the wires of the source/drain electrodes 14 as shown in FIGS. 12 through 15.

Figure 8:
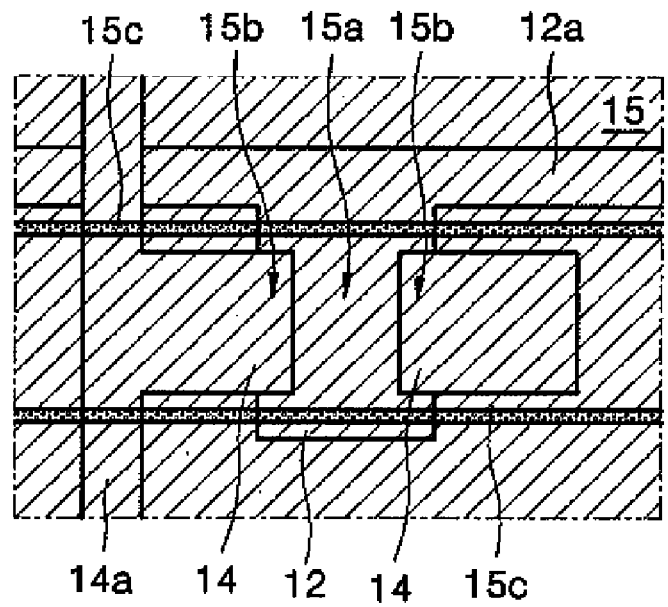
Figure 9:
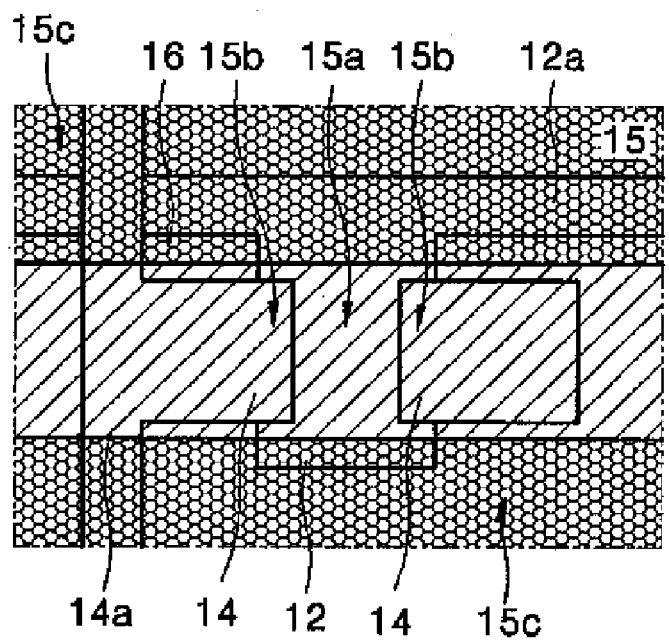
Figure 10:
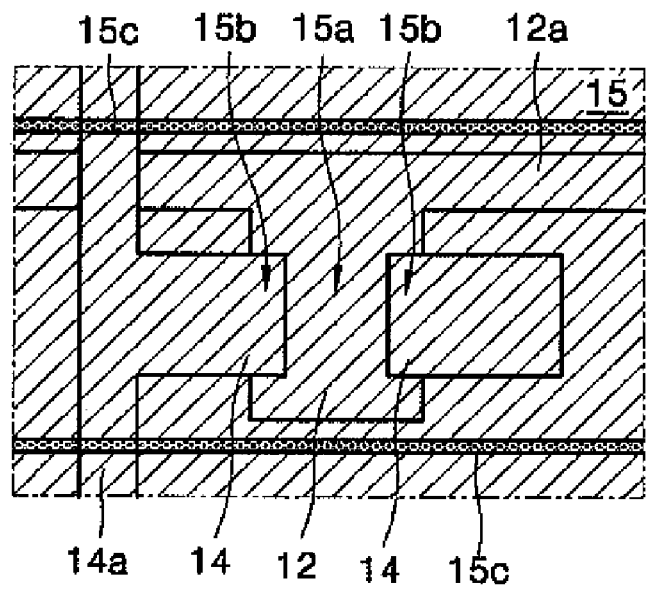
Figure 11:
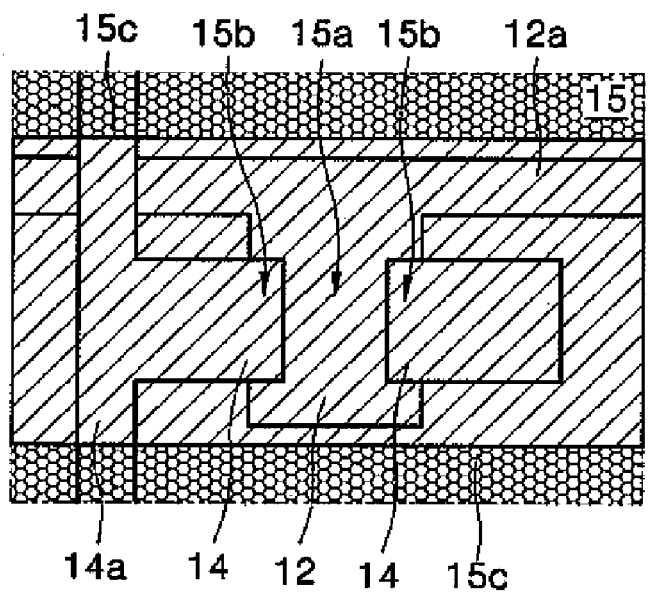

The transformed region 15c may be formed across the gate electrode 12 on the inside of the gate wire 12a as shown in FIGS. 8 and 9. Also, the transformed regions 15c may be formed on outside of the gate wire 12a and on outside of the gate electrode 12 as shown in FIGS. 10 and 11.

Figure 12:
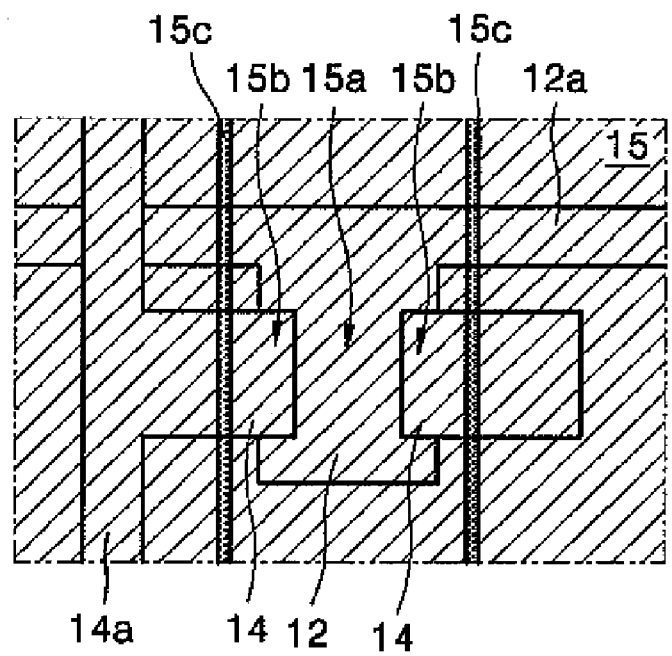
Figure 13:
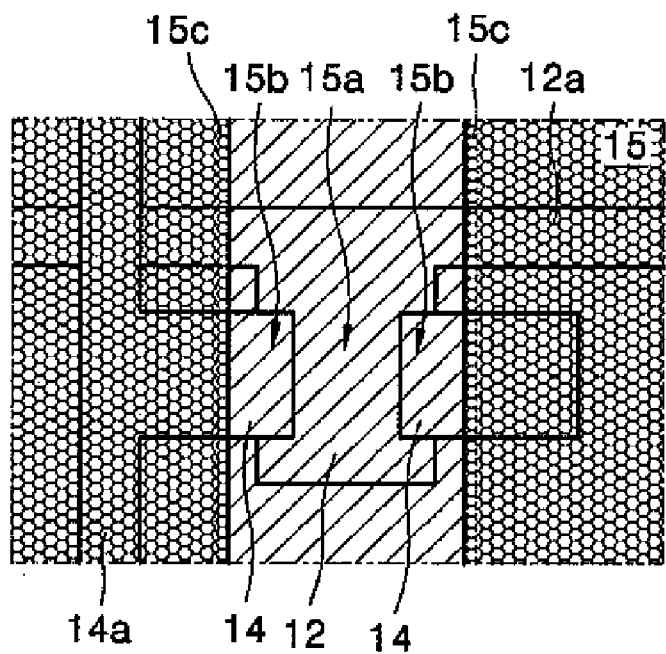
Figure 14:
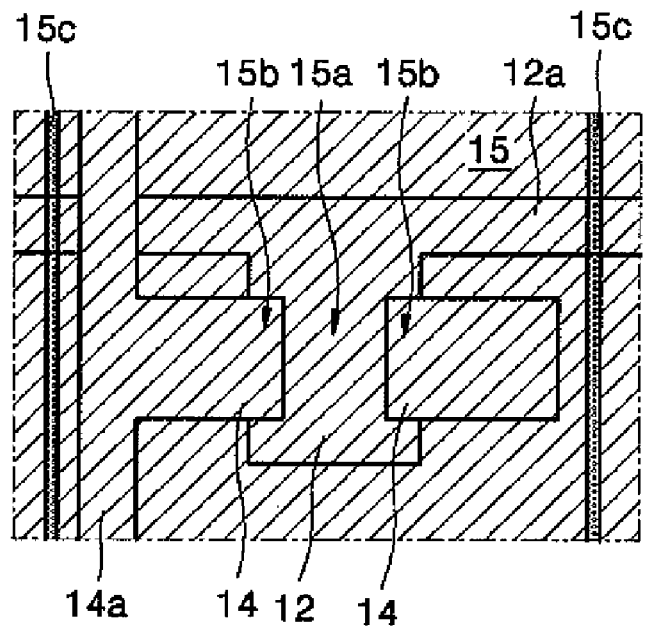
Figure 15:
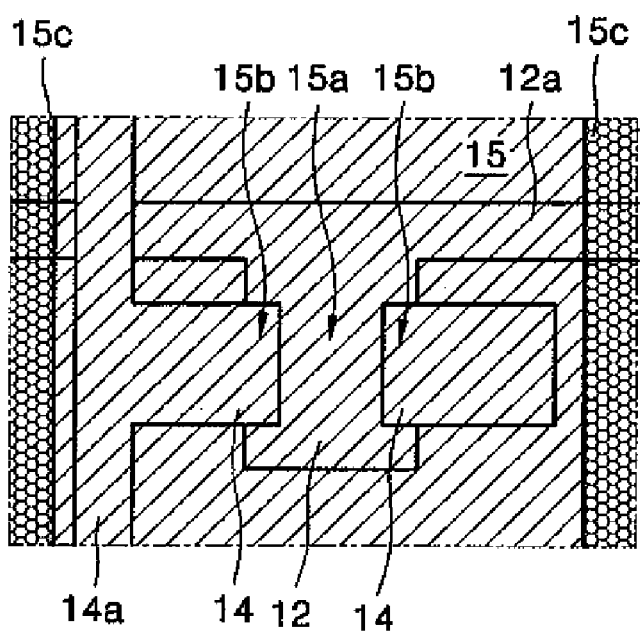

Furthermore, the transformed region 12 may be formed to have an inside boundary across the source/drain electrode 14 as shown in FIGS. 12 and 13 and the transformed region 15c is formed on the outside of the source/drain electrode 14 as shown in FIGS. 14 and 15.

Figure 16:
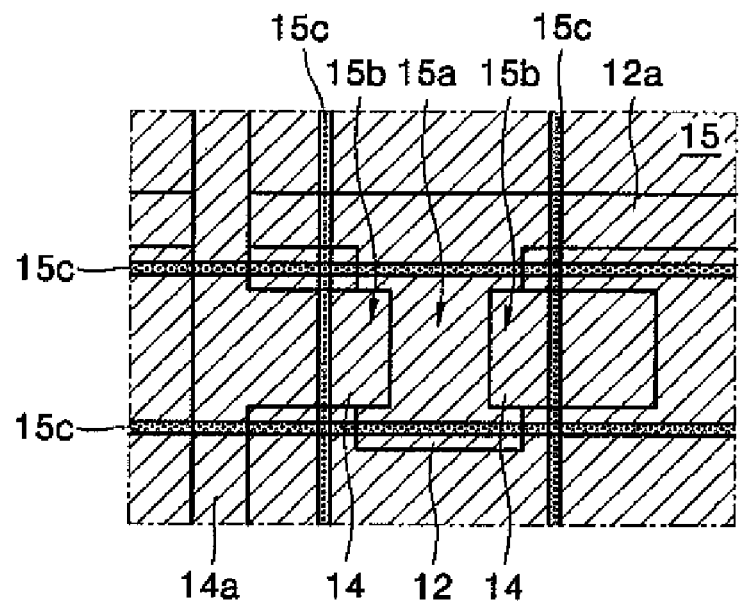
Figure 17:
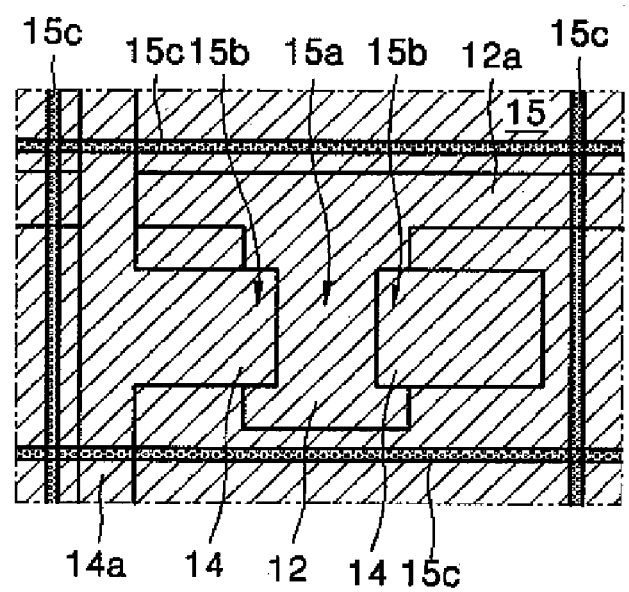

As shown in FIGS. 16 and 17, the transformed regions 15c may be formed on two pairs of substantially parallel lines. The channel region 15a is located between the transformed regions 15c formed on the two pairs of substantially parallel lines. One of two pairs of substantially parallel lines may be substantially parallel to the gate wire 12a and the other of two pairs is substantially parallel to one 14a wires of source/drain electrodes 14. As shown in FIG. 16, the transformed region 15c may be formed across the gate electrode 12 and the source/drain electrode 14. Also, the transformed region 15c may be formed on outside of the gate electrode 12 and the source/drain electrode 14 as shown in FIG. 17.

As shown in FIGS. 4 through 17, the transformed regions 15c further includes a line substantially parallel to a line connecting the source/drain regions 15b and the channel region 15a. Accordingly, a width of the channel region 15a can be verified, by the transformed region 15c so as to be closer to the design width, or anticipated width.

The thin film transistor (TFT) may have various lamination structures in addition to the lamination structure shown in FIG. 1.

Figure 18:
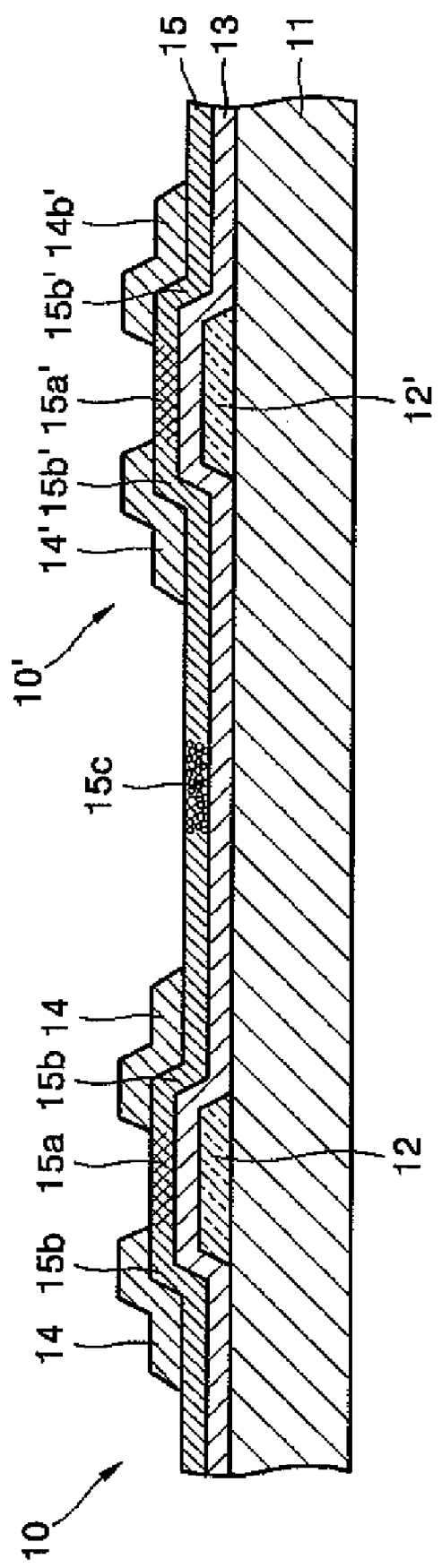
FIGS. 18 through 21 are cross sectional views of thin film transistors having various lamination structures in accordance with the present embodiments.

FIG. 18 is a diagram of a thin film transistor having a lamination structure in accordance with one embodiment. As shown in FIG. 18, the gate insulation layer 13 is formed on the substrate 11 and the organic semiconductor layer 15 is formed on the gate insulation layer 13. After forming the organic semiconductor layer 15, the source/drain electrodes 14 are formed on the organic semiconductor layer 15. The predetermined region of the organic semiconductor layer 15 is irradiated with light to form the transformed region 15c before forming the source/drain electrodes on the organic semiconductor layer 15.

Figure 19:
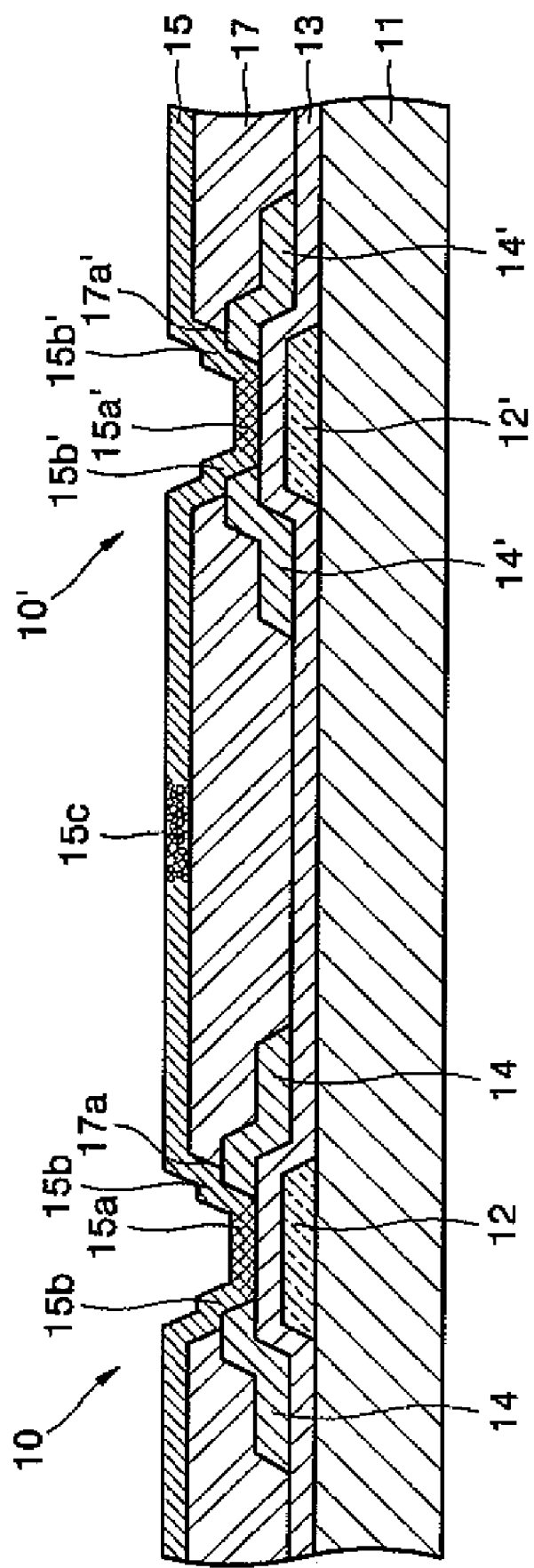

FIG. 19 is a diagram of a thin film transistor having another lamination structure. As shown in FIG. 19, a passivation layer 17 is additionally formed on the organic semiconductor layer 15. The passivation layer 17 covers the source/drain electrodes 14 and 14'. The passivation layer 17 includes opening units 17a and 17a'. The channel regions 15a and 15a' may be formed on the opening units 17 and 17a'.

An organic material, an inorganic material or both can be used for forming the passivation layer 17. The inorganic material includes, for example, $SiO_2$, SiNx, $AL_2O_3$, $TiO_2$, $Ta_2O_5$, $HfO_2$, $ZrO_2$, BST ($(Ba,Sr) TiO_3$) and PZT ($(Pb,Zr) TiO_3$). Also, the organic material can include for example, a common polymer such as PMMA (polymethyl methacrylate), and PS (polystyrene), a polymer derivative having phenol group, an acrylic polymer, an imide polymer, an aryl-ether polymer, an amide polymer, a fluoric polymer, a p-xylene polymer, a vinyl alcoholic polymer or a blend of any of these. Also, inorganic-organic stacked layers can be used.

It is possible to perform a SAM process (a conventional process for forming a Self-Assembled Monolayer) such as OTS (Octadecyltrimethoxysilane) and HMDS (hexamethyldisilazane) on an uppermost layer adjacent to the organic semiconductor layer 15 of the passivation layer 17 and also a coating process can be performed on the uppermost layer by using a fluoric polymer thin film or the common polymer thin film.

Figure 20:
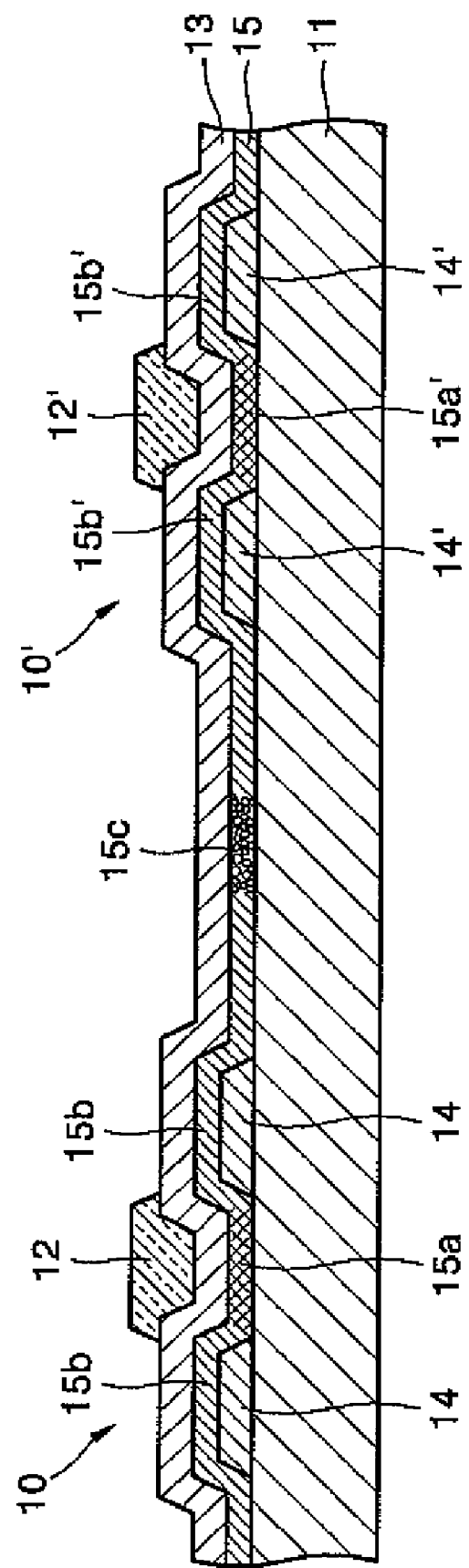

FIG. 20 is a diagram of a thin film transistor (TFT) having a staggered structure in accordance with another embodiment.

As shown in FIG. 20, the source/drain electrodes 14 and 14' are formed on the substrate 11 and the organic semiconductor layer 15 is formed on the source/drain electrodes 14 and 14'. The organic semiconductor layer 15 covers the source/drain electrodes 14 and 14'. The gate insulation layer 13 is formed on the organic semiconductor layer 15 and the gate electrodes 12 and 12' are formed where the channel regions 15a and 15a' are faced.

The transformed region 15c is formed on a predetermined region between TFTs 10 and 10' of the organic semiconductor layer 15.

Accordingly, when irradiation with light or the thermal process is performed for forming the transformed region 15c after forming the source/drain electrodes 14 and 14' on the substrate 11 and forming the organic semiconductor layer 15 for covering the source/drain electrodes 14 and 14'.

Figure 21:
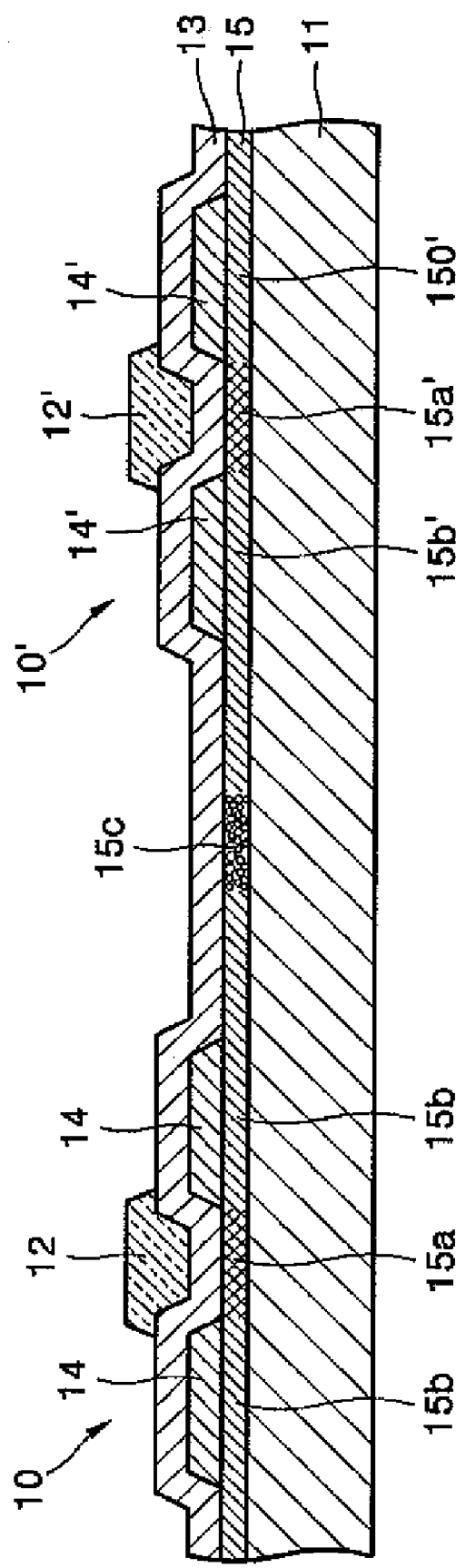

However, the source/drain electrodes 14 and 14' may be formed after forming the organic semiconductor layer 15 on the substrate 11 as shown in FIG. 21. In this case, the light is radiated or the terminal process is performed after forming the organic semiconductor layer 15 on the substrate 11 and before forming the source/drain electrodes 14 and 14'.

The SAM process including OTS and HMD can be performed on an uppermost layer adjacent to the organic semiconductor layer 15 of the thin film transistors of FIGS. 20 and 21. Also, the uppermost layer of the thin film transistors of FIGS. 20 and 21 can be coated with the fluoric polymer thin film or the common polymer thin film.

The above mentioned transformed region 15c may be implemented on various structures of the thin film transistor.

The above mentioned thin film transistors (TFT) may be included in a flat panel display such as an organic light emitting display and liquid crystal display (LCD).

Figure 22:
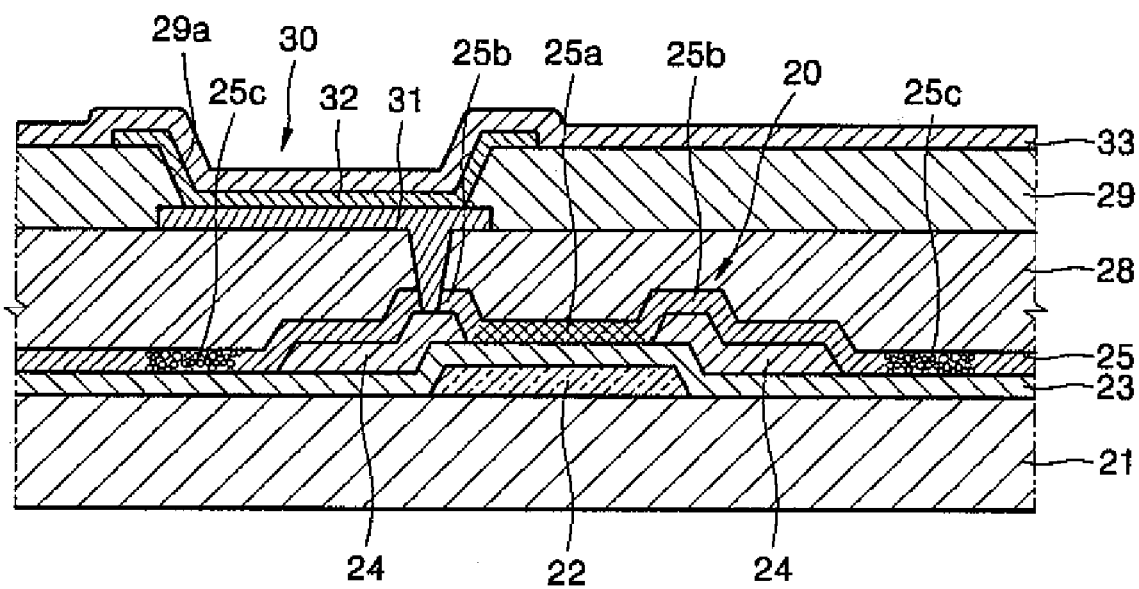
FIG. 22 is a cross sectional view of an organic light emitting display having a thin film transistor of FIG. 1.

FIG. 22 is a diagram of an organic light emitting display having a thin film transistor in accordance with an embodiment.

FIG. 22 shows one of the subpixels included in the organic light emitting display. The subpixel includes an organic light emitting diode (OLED) as a self emitting element, at least one of thin film transistors and an additional capacitor (not shown).

The organic light emitting display has various pixel patterns according to colors emitted from the organic light emitting diode (OLED). In one embodiment, the organic light emitting display includes pixels for red, green and blue.

As shown in FIG. 22, each subpixel of red, green and blue colors includes a TFT and the OLED. The TFT may be one of the TFTs described above. However, the present embodiments are not limited to the above mentioned TFTs. The subpixel may have various structures of thin film transistors.

As shown in FIG. 22, the thin film transistor (TFT) 20 is formed on an insulation substrate 21.

The TFT 20 includes a gate electrode 22 having a predetermined pattern on a substrate 21, a source/drain electrode 24 formed on the gate insulator layer 23 and an organic semiconductor layer 25 is formed on the source/drain electrodes 24.

The organic semiconductor layer 25 includes a source/drain region 25b, a channel region 25a connecting the source/drain regions 25b and a transformed region 25c. The transformed region 25c is identical to the transformed region 15c in FIGS. 1 through 21 and thus detailed explanation of the transformed region 25c is omitted.

After forming the organic semiconductor layer 25, a passivation layer 28 is formed to cover the TFT 20. The passivation layer 28 may be formed as a single layer or a plurality of layers by using an organic material (for example PMMA (polymethyl methacrylate), PS (polystyrene), a polymer derivative having one or more phenol groups, an acrylic polymer, an imide polymer, an aryl-ether polymer, an amide polymer, a fluoric polymer, a p-xylene polymer, or a vinyl alcoholic polymer), an inorganic material (such as, for example, $SiO_2$, $SiN_x$, $AL_2O_3$, $TiO_2$, $Ta_2O_5$, $HfO_2$, $ZrO_2$, BST or PST) or a blend of organic and inorganic materials.

A pixel electrode 31 is formed on the passivation layer 28 and a pixel definition layer 29 is formed on the pixel electrode 31. The pixel electrode 31 is one of the electrodes of the OLED 30. A predetermined opening unit 29a is formed on the pixel definition layer 29 and then an organic emitting layer 32 of the OLED 30 is formed.

The OLED 30 displays predetermined image information by emitting red, green and blue colors according to flow of current. The OLED 30 includes a pixel electrode 31 connected to one of the source/drain electrodes 24 of the TFT 20, a counter electrode 33 formed for covering the entire pixel and an organic emission layer 32.

The pixel electrode 34 and the counter electrode 33 are insulated by the organic emission layer 32. The pixel electrode 34 and the counter electrode 33 supply voltage of different polarities to the organic emission layer 32 for emitting light of colors.

A small molecule organic layer or a polymer organic layer may be used for the organic emission layer 32. In case of using the small molecule organic layer, the organic emission layer 32 may be formed as a single structure or a complex structure including a hole injection layer (HIL), a hole transport layer (HTL), an emission layer (EML), an electro transport layer (ETL) and an electron injection layer (EIL). A copper phthalocyanine (CuPc), N, N'-Di (naphthalene-1-yl)-N, N'-diphenyl-benzidine (NPB) and tris-8-hydroxyquinoline aluminium (Alq3) can be used for the organic material. The small molecule organic layer is formed by a vacuum evaporation method.

In case of using the polymer organic layer, the organic emission layer 32 includes the HTL and EML. PEDOT (polyethylenedioxythiophene) is used for the HTL and a polymer organic material including poly-phenylenevinylene (PPV) or polyfluorene is used for the EML. A screen printing or an ink-jet printing method can be used for forming the organic emission layer 32.

However, the organic layer is not limited to being formed by the above mentioned method and materials. Various embodiments can be implemented to form the organic layer.

The pixel electrode 31 works as an anode electrode and the counter electrode 33 works as cathode electrode. However, the polarity of the pixel electrode 31 and the counter electrode 33 may be switched.

However, the present embodiments are not limited to have the above mentioned structure. Various structures of organic electroluminescent displays may be utilized in the present embodiments.

In the case of liquid crystal display (LCD), a bottom alignment layer (not shown) is formed to cover the pixel electrode 31 for manufacturing a bottom substrate of the LCD.

The TFT of the present embodiments may each be equipped with one or more sub pixels as shown in FIG. 22. Also, the TFT of the present embodiments may be equipped with a driver circuit (not shown) or other electric circuits which do not reproduce images.

A flexible plastic substrate is preferably used as the substrate 21 for the organic electro luminescent display.

As mentioned above, the TFT is distinguished from an adjacent TFT by the transformed region in the present embodiments. In the present embodiments, the transformed region having a different size of crystal is formed on the organic semiconductor layer between the TFTs. This gives the same result as patterning the organic semiconductor layer. Therefore, the complicated pattern process is not performed for manufacturing the TFT of the present embodiments.

Also, a dry etching process or a wet etching process is not required for manufacturing the TFT of the present embodiments. Therefore, characteristic degradation of the active channel is minimized.

Also, because etching is not required, processing time of a TFT is reduced and the processing efficiency of the TFT is improved.

Moreover, leakage current is minimized by isolating the channel region from the adjacent TFT.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing a thin film transistor comprising a gate electrode, a source electrode and a drain electrode, each insulated from the gate electrode; and an organic semiconductor layer having a channel region insulated from the gate electrode and coupled to the source and the drain electrodes, the method comprising irradiating with light the area around at least the channel region of the organic semiconductor layer wherein the conductivity of the organic semiconductor layer is reduced;

wherein at least the channel region of the organic semiconductor layer is not irradiated with light.

2. The method of claim 1, wherein the organic semiconductor layer is irradiated by a laser.

3. The method of claim 1, wherein the organic semiconductor layer is irradiated with ultraviolet light.

4. The method of claim 1, wherein the organic semiconductor layer comprises at least one of pentacene, tetracene, anthracene, naphthalene, alpha-6-thiophene, alpha-4-thiophene, perylene, rubrene, coronene, perylene tetracarboxylic diimide, perylene tetracarboxylic dianhydride, a oligonaphthalene, oligothiophene of alpha-5-thiophene, phthalocyanine including a metal, phthalocyanine not including a metal, naphthalene tetracarboxylic diimide, naphthalene tetracarboxylic dianhydride, pyromellitic dianhydride, pyromellitic diimide, conjugate polymer containing thiophene and a polymer containing fluorene.

5. A method of manufacturing a thin film transistor comprising a gate electrode; a source electrode and a drain electrode, each insulated from the gate electrode; and an organic semiconductor layer having a channel re ion insulated from the gate electrode and coupled to the source and drain electrodes,
wherein the method comprises performing a thermal process on the organic semiconductor layer at least near the channel region of the organic semiconductor layer after forming the organic semiconductor layer, wherein the conductivity of the organic semiconductor layer is reduced;
wherein the thermal process is not performed on at least the channel region of the organic semiconductor layer.

6. The method of claim 5, wherein the organic semiconductor layer comprises at least one of pentacene, tetracene, anthracene, naphthalene, alpha-6-thiophene, alpha-4-thiophene, perylene, rubrene, coronene, perylene tetracarboxylic diimide, perylene tetracarboxylic dianhydride, oligonaphthalene, oligothiophene of alpha-5-thiophene, phthalocyanine including a metal, phthalocyanine not including a metal, naphthalene tetracarboxylic diimide, naphthalene tetracarboxylic dianhydride, pyromellitic dianhydride, pyromellitic diimide, conjugate polymer containing thiophene and a polymer containing fluorene.

7. A method of manufacturing a flat panel display, comprising:
forming a thin film transistor comprising a gate electrode formed on a substrate; a source electrode and a drain electrode, each insulated from the gate electrode; and an organic semiconductor layer having a channel region insulated from the gate electrode and coupled to the source and drain electrodes; and
forming a pixel electrode electrically connected to one of the source and the drain electrodes of the thin film transistor,
the method comprises irradiating with light the area around at least the channel region of the organic semiconductor layer wherein the conductivity of the organic semiconductor layer is reduced;
wherein at least the channel region of the organic semiconductor layer is not irradiated with light.

8. The method of claim 7, wherein the organic semiconductor layer is irradiated with a laser.

9. The method of claim 7, wherein the organic semiconductor layer is irradiated with ultraviolet light.

10. The method of claim 7, wherein the organic semiconductor layer comprises at least one of pentacene, tetracene, anthracene, naphthalene, alpha-6-thiophene, alpha-4-thiophene, perylene, rubrene, coronene, perylene tetracarboxylic diimide, perylene tetracarboxylic dianhydride, oligonaphthalene, oligothiophene of alpha-5-thiophene, phthalocyanine including a metal, phthalocyanine not including metal, naphthalene tetracarboxylic diimide, naphthalene tetracarboxylic dianhydride, pyromellitic dianhydride, pyromellitic diimide, conjugate polymer containing thiophene and a polymer containing fluorene.

11. A method of manufacturing a flat panel display, comprising:
forming a thin film transistor comprising a gate electrode formed on a substrate, a source electrode and a drain electrode, each insulated from the gate electrode; and an organic semiconductor layer having a channel region insulated from the gate electrode and coupled to the source and the drain electrodes; and
forming a pixel electrode electrically connected to one of the source and the drain electrodes of the thin film transistor,
the method comprises performing a thermal process on the organic semiconductor layer at least near the channel region of the organic semiconductor layer after forming the organic semiconductor layer, wherein the conductivity of the organic semiconductor layer is reduced;
wherein the thermal process is not performed on at least the channel region of the organic semiconductor layer.

12. The method of claim 11, wherein the organic semiconductor layer comprises at least one of pentacene, tetracene, anthracene, naphthalene, alpha-6-thiophene, alpha-4-thiophene, perylene, rubrene, coronene, perylene tetracarboxylic diimide, perylene tetracarboxylic dianhydride, oligonaphthalene, oligothiophene of alpha-5-thiophene, phthalocyanine including metal, phthalocyanine not including metal, naphthalene tetracarboxylic diimide, naphthalene tetracarboxylic dianhydride, pyromellitic dianhydride, pyromellitic diimide, conjugate polymer containing thiophene and a polymer containing fluorene.

* * * * *

UNITED STATES PATENT AND TRADEMARK OFFICE
CERTIFICATE OF CORRECTION

| | | |
|---|---|---|
| PATENT NO. | : 8,043,887 B2 | Page 1 of 1 |
| APPLICATION NO. | : 12/641277 | |
| DATED | : October 25, 2011 | |
| INVENTOR(S) | : Yang et al. | |

It is certified that error appears in the above-identified patent and that said Letters Patent is hereby corrected as shown below:

| Issued Patent | | Description of Discrepancy |
|---|---|---|
| Column | Line | |
| 8 | 12 | Change "Picker" to --Ficker--. |
| 8 | 14 | Change "Picker" to --Ficker--. |
| 11-12 | 67 (Col. 11) 1 (Col. 12) | Change "hydroxyquionoline" to --hydroxyquinoline--. |
| 13 | 19 (Approx.) | In Claim 5, change "re ion" to --region--. |

Signed and Sealed this
Thirty-first Day of July, 2012

David J. Kappos
*Director of the United States Patent and Trademark Office*